United States Patent
Gruber et al.

(10) Patent No.: US 6,362,557 B1
(45) Date of Patent: Mar. 26, 2002

(54) ULTRASONIC METHOD AND ACTUATOR FOR INDUCING MOTION OF AN OBJECT

(75) Inventors: Peter A. Gruber, Mohegan Lake; Frederic Maurer, Valhalla; George F. Walker, New York, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/649,486

(22) Filed: Aug. 28, 2000

(51) Int. Cl.$^7$ ............................................. H01L 41/08
(52) U.S. Cl. ........................... 310/323.02; 310/323.16
(58) Field of Search ...................... 310/323.02, 323.06, 310/323.12, 328

(56) References Cited

U.S. PATENT DOCUMENTS

| | | | | |
|---|---|---|---|---|
| 4,613,782 A | * | 9/1986 | Mori et al. | 310/323.02 |
| 4,728,843 A | * | 3/1988 | Mishiro | 310/323.02 |
| 5,247,751 A | * | 9/1993 | Ohya et al. | 310/325 X |
| 5,696,421 A | * | 12/1997 | Zumeris et al. | 310/323.02 |
| 6,064,140 A | * | 5/2000 | Zumeris | 310/323.02 |
| 6,066,911 A | * | 5/2000 | Lindenmann et al. | 310/323.02 |
| 6,121,717 A | * | 9/2000 | Diefenbach et al. | 310/323.02 |

FOREIGN PATENT DOCUMENTS

| | | | | |
|---|---|---|---|---|
| DE | 220466 | * | 12/1983 | 310/323.16 |
| JP | 0315280 | * | 12/1989 | 310/323 |
| SU | 788229 | * | 12/1979 | 310/323.16 |
| SU | 858153 | * | 8/1981 | 310/323.16 |
| SU | 1023456 | * | 6/1983 | 310/323.16 |
| SU | 1023458 | * | 6/1993 | 310/323.16 |

* cited by examiner

Primary Examiner—Mark O. Budd
(74) Attorney, Agent, or Firm—Robert M. Trepp; Randy W. Tung

(57) ABSTRACT

An actuator scaled to macroscopic or microscopic sizes, uses ultrasonic energy to induce motion of an object in a desired direction. The actuator includes one or more pair of piezoelectric transducers connected with a transducer tip. Supplying the piezoelectric transducers with alternating current electrical power causes the tip to vibrate at ultrasonic frequencies. Urging the vibrating tip into contact with a surface on the object at a selected angle of inclination induces the object to move in the desired direction at a rate determined by the inclination angle. Multiple actuators can be used to induce a fall range of movements of variously shaped objects. In microscopic form, the actuator can be used to create a MEMS device. The optional application of a compliant material either on the transducer tip or on the object's surface enhances the movement induced by the actuator.

8 Claims, 4 Drawing Sheets

Stationary
Up - down, 90 deg.
contact angle, no pivot

Fast - left
Up - down, >>90 deg.
contact angle, large pivot

Slow - right
Up - down, <90 deg.
contact angle, small pivot

ULTRASONIC METHOD AND ACTUATOR FOR INDUCING MOTION OF AN OBJECT

FIELD OF THE INVENTION

The present invention broadly relates to motors and actuators of both macroscopic and microscopic scale, and deals more particularly with an actuator and a related method for moving objects using ultrasonic energy.

BACKGROUND OF THE INVENTION

Miniaturization of motors, actuators and similar machine parts is receiving increasing attention because of the new uses of these devices made possible because of their small size. Additionally, these devices can be manufactured in large quantities at low piece-part cost. Current designs of miniaturized machine parts can be categorized according to size or scale. Macroscopic machine parts have a length in the range of approximately 1 to 10 inches, and while microscopic machine parts, sometimes referred to as MEMS (Micro Electro Mechanical Systems) have a length in the range of 0.01 to 1 inch.

In any event, existing miniaturized actuators and motors of both macroscopic of microscopic size are essentially replicas of larger motors, and thus include such component parts as windings, stators, gears, transmission links, etc. These miniaturized parts must be assembled with high precision in order to produce an operable device providing the desired function, e.g. movement of an electrically activated component that then mechanically engages other parts to induce motion. Depending upon the engagement configuration, this motion may be linear in any of several axes, rotary, circular, etc. Because of the number of complex parts that must be assembled with a high degree of precision, the yields of parts meeting target specifications and performance are relatively low using current manufacturing processes. These low yields in turn increase the cost of the parts. Accordingly, it would be desirable to provide a new form of actuator and related method for inducing movement of an object on a microscopic or macroscopic scale which eliminates the problems mentioned above.

It is therefore an object of the present invention to provide an actuator and related method for inducing motion of an object which utilizes an ultrasonic transducer as the prime motive power source.

Another object of the invention is to provide an actuator and related method of the type mentioned above which employs well known piezoelectric devices powered by an alternating current power supply that generates ultrasonic vibrations which can be applied to the surface of an object in order to induce motion of the object.

A further object of the invention is to provide an actuator and method as generally described above, which is especially simple to manufacture at low cost while providing high manufacturing yields in the production process.

Another object of the invention is to provide simple, miniaturized actuators that can be used in combination with each other to produce a variety of movements and motions of an object.

These, and further objects and advantages of the present invention will be clear or will become apparent during the course of the following description of a preferred embodiment of the present invention.

SUMMARY OF THE INVENTION

According to one aspect of the invention, an ultrasonic motion actuator is provided for inducing movement of an object, comprising an ultrasonic transducer having at least two piezoelectric crystals arranged to generate longitudinal vibratory movement in response to the application thereto of alternating current electrical power. The actuator further includes a transducer tip connected with the crystals that may be used to contact the surface of an object in order to transmit the vibratory movement to the object. The frictional engagement of the tip and accompanying vibratory motion imposes a force on the object that induces motion thereof in a direction determined by the inclination angle of the transducer tip. The transducer, including the tip, may be either macroscopic or microscopic in size. Typically, the tip may be fabricated of a metallic material such as stainless steel. The tip may optionally include a coating of compliant material thereon such as a cured polyimide or rubber. Alternatively, the compliant material may be formed on the surface of the object in order to increase surface friction between the object and the transducer tip.

According to another aspect of the invention, a method is provided for moving an object in a desired direction, comprising the steps of providing an ultrasonic transducer having a tip that vibrates along a longitudinal axis when power is applied to the transducer; urging the tip into vibratory contact with a surface on the object; inclining the transducer tip relative to the surface such that the tip axis is aligned with and pointed in the desired direction of movement; and, supplying electrical power to the transducer so as to cause the tip to vibrate. By changing the angle of inclination of the transducer tip, the force component in the desired direction of travel is either increased or decreased, thus increasing or decreasing the speed of movement of the object. The object may be moved in any of three orthogonal axes by employing a pair of the transducers to engage at least two different surfaces on the object.

The actuator of the present invention can be employed to produce tilting movement of a rigid body about a pivot point by employing a first actuator to hold the body against a fulcrum while a second actuator is employed to impart a moment on one end of the body so as to cause the latter to tilt about the pivot point.

The actuator of the present invention can be advantageously employed as a drive for rotating a disk, such as a computer memory disk, about an axis of rotation. The drive includes an ultrasonic transducer for producing longitudinal vibratory movement when energized by alternating current electrical power, and a transducer tip in contact with and inclined relative to the surface of the disk for transmitting a longitudinal vibratory movement to the disk which results in a force being imposed on the disk that causes it to rotate about the axis.

BRIEF DESCRIPTION OF THE DRAWINGS

In the drawings which form an integral part of the specification and are to be read in conjunction therewith, and in which like components are designated by identical components in the various views.

DETAILED DESCRIPTION OF THE PREFERRED EMBODIMENT

In accordance with the present invention, an actuator is provided for inducing motion of an object by employing an ultrasonic transducer that is activated at typical ultrasonic frequencies. As will be discussed below in more detail, the transducer is provided with a vibrating tip that is placed in frictional contact with a surface on the object so as to transmit energy from the transducer to the object's surface. Depending on the contact angle of the vibrating tip relative to the contacted surface, a component of force is transmitted from the tip to the object which causes the object to move in the direction of the force component.

Figure 7:
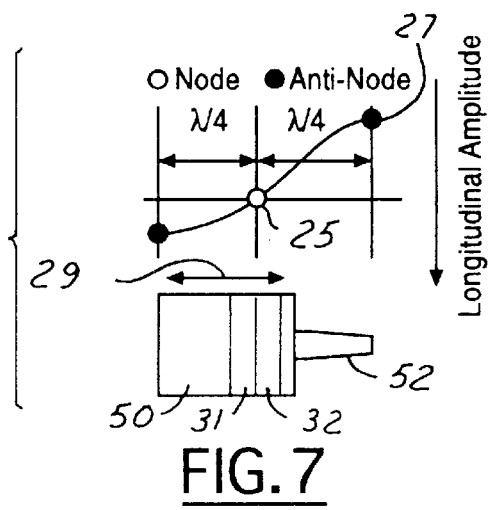
FIG. 7 is a side view of an actuator in accordance with the preferred embodiment of the present invention, shown in relation to a graph depicting longitudinal amplitude along the length of the actuator.
Figure 8:
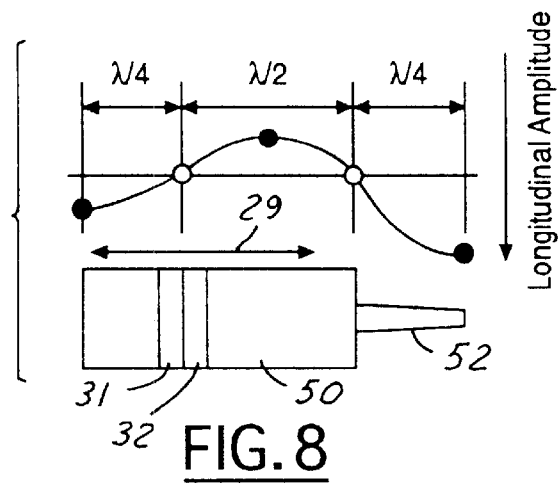
FIG. 8 is a view similar to FIG. 7 but depicting a longer actuator transducer having a different resonant frequency.

One form of the actuator of the present invention is depicted in FIG. 7. The actuator includes a cylindrical body 50, which may be formed of stainless steel, on one end of which there is provided an elongate tip 52. The exact geometry of the end of the tip will depend in the particular application, but generally, a geometry that produces maximum frictional contact and which "digs in" to the object's surface is highly desirable. Body 50 houses a pair of well known piezoelectric crystals 31, 32 that are arranged in face-to-face contact such that their polarities are opposite (+/+or −/−) at the junction between the contacting crystals. Because the actuator is vibrating at ultrasonic frequencies, the amplitude of these longitudinal vibrations possesses nodes along the length of the actuator; this variation in longitudinal amplitude is a function of length. The nodes are points along the length of the transducer where the amplitude is zero. The graph of longitudinal amplitude versus length is shown in the graph of FIG. 7; from this view, it can be seen that the piezoelectric crystals are located at a node 25. In other words, at the longitudinal point of the junction between the two crystals, the amplitude of the vibration is zero. As a result, expansion and contraction of the crystals upon excitation thereof causes them to expand or contract against each other with equal force. The vibrational energy is transmitted to the tip 52; this energy is at its maximum value at the outer end of the tip which corresponds to anti-node 27. FIG. 8 is a view similar to FIG. 7 but shows a transducer having a longer length than that shown in FIG. 7. The length of the transducer determines its resonant frequency. The bidirectional arrow 29 in FIGS. 7 and 8 represents the direction of tip vibration, i.e. along the longitudinal axis of the actuator body 50.

The actuator of the present invention may be either of macroscopic or a microscopic scale. As used herein "macroscopic" is defined as actuators having a length in the size of 1 to 10 inches while "microscopic" is defined as an actuator having a length of between approximately 0.01 to 1 inch.

Figure 9:
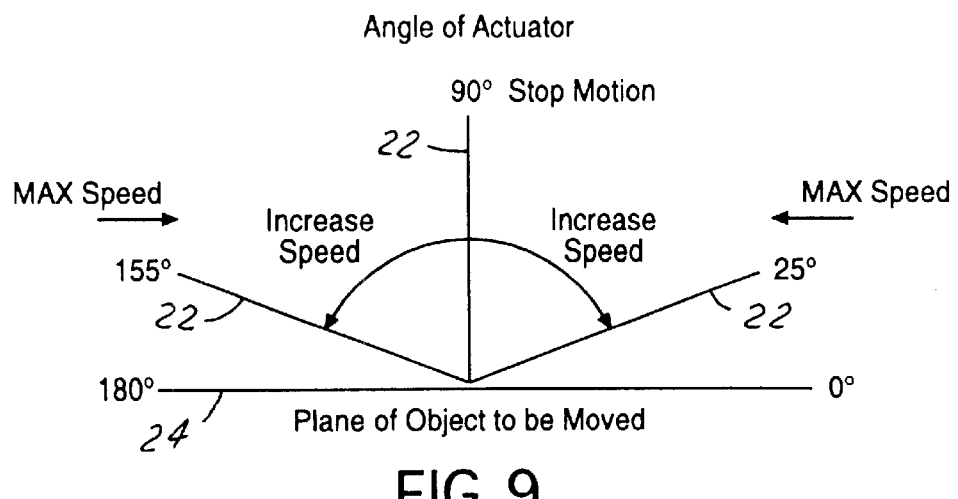
FIG. 9 is a diagram showing how the speed of movement of the object is affected by the contact angle of the transducer tip; and, FIGS. 10(a)–10(c) are diagrammatic views depicting three successive states of a machine for producing tipping movement of a rigid body, using actuators in accordance with the present invention.

The inventors have successfully constructed and operated a prototype actuator according to the present invention. This prototype actuator, which includes a transducer that is commercially available from Sono-Tek Corp. of Milton, N.Y., was approximately 4.5 inches long and 1.5 inches in diameter, and operated at a frequency of 60 KHz. The typical frequency range for macro piezoelectric transducers is in the range of 25 KHz to 120 KHz, with the actual length of the actuator determining the resonant frequency, as indicated earlier. The prototype actuator described above was employed to move a series of objects. FIG. 9 depicts the range of inclination through which the prototype actuator was moved in order to achieve movement of a flat object 24 within a plane. The tip 52 was brought into contact with the object 24, and when the actuator was held such that its longitudinal axis was held perpendicular or at 90 degrees relative to the plane of the object's surface, as shown in FIG. 9, there was no lateral movement of the object 24. However, as the actuator was inclined toward the left or toward the right as shown in FIG. 9, a component of lateral force was imposed upon the object 24, causing the latter to move in the direction of inclination of the actuator. As the angle was increased, the speed of movement of the object 24 increased. It was found that at both 25 and 155 degrees of inclination, the vibrations imparted from the actuator transmitted the greatest amount of lateral energy, thus moving the object at maximum speed. In this example, the power supplied to the prototype actuator was about 15 watts or less, using a conventional line voltage (110–115 V) and delivery of a maximum of 60–70 volts RMS to the actuator. Depending upon the power setting, it was found that the longitudinal, vibratory motion of the tip 52 was between 2 and 6 microns at a resonant frequency of 60 KHz. It was found that the amount of tip motion is determined not only by the power setting, but by the length of the actuator as well. The free speed of movement of the object is approximately equal to the motion length of the tip multiplied by the frequency of vibrations of the tip. Thus for example, with a tip movement of 6 microns vibrating at 60 KHz, the free speed would be approximately 0.36 m/s. The lineal speed of the object moved by the actuator is dependent upon the tip angle, as well as the level of friction between the surface and the tip, as previously discussed. Depending on the exact type of actuator and tip, the typical range of lineal speed of the object is between 0.001 and 1.0 m/s.

Figure 1A:
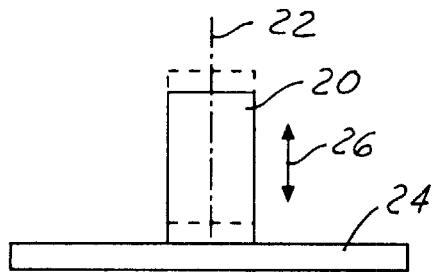
FIG. 1(a) is a diagrammatic, side view showing the tip of the actuator transducer of the present invention engaging a planar body to be moved.
Figure 1B:
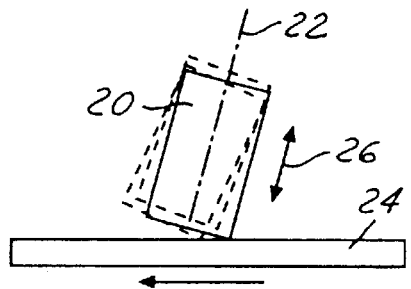
FIG. 1(b) is a view similar to FIG. 1(a) but showing the transducer tip inclined so as to move the body in one direction.
Figure 1C:
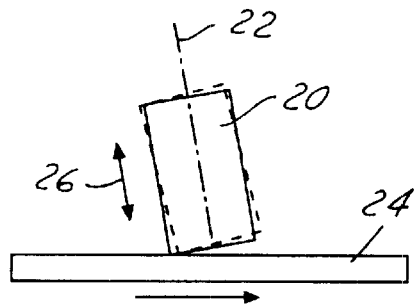
FIG. 1(c) is a view similar to FIG. 1(b), but showing the transducer tip inclined in the opposite direction so as to move the body in the opposite direction.

The various types of movement of different kinds of objects that can be achieved using the actuator of the present invention will now be discussed, and in this connection, reference is now made to FIG. 1a through 1c. An actuator tip 20 forming part of the actuator (not shown) of the present invention possesses a longitudinal axis 22, which in the case of FIG. 1a is arranged perpendicular to the surface of a flat object 24 to be moved. The tip can be seen to possess an essentially square face with a pair of edges that are intended to dig into the object's surface. Upon energizing of the actuator, the tip 20 vibrates longitudinally in the direction of the arrows 26 and imposes a force on the object 24 which does not have a lateral component. In other words, the force imposed on the object by the tip is perpendicular to the object's surface. Consequently, there is no lateral movement of the object 24. However as shown in FIG. 1b, when the tip 20 is inclined toward the right, the force imposed on the object 24 by the tip 22 includes a lateral component which causes the object 24 to move towards the left. Conversely, as shown in FIG. 1c, when the tip 20 is inclined towards the left, a lateral component of force is imposed on the object 24 which causes the latter to move toward the right. The greater the angle of inclination of the tip 20, relative to the surface of the object 24, the faster the movement. In other words, the lateral component of force imposed on the object 24 is directly proportional to the amount of inclination or angular offset from the vertical or 90 degree position of the tip 20, shown in FIG. 1a.

The preceding description of the operation of the actuator with reference to FIG. 1a–1c assumes a mechanical support (not shown) for the vibrating tip 20 that permits a slight pivoting action when offset from a perpendicular position. This pivoting motion causes the tip to frictionally engage the contacting surface during the downward movement of the tip during each cycle of vibration. The basic motion achieved by the actuator of the present invention can be illustrated by an example taken from the logging industry. To move individual logs that float in rivers towards saw mills, loggers will walk on them with calks (steel-spiked boots). The calks frictionally engage the logger's moving feet with the log surface and cause the bipedal motion to produce a lineal motion of the log. If the logger is able to keep himself stationary, his walking motion moves the log at the speed of his gait. Smaller, slower steps produce slower movement; larger, faster steps produce faster motion in the log. In a similar manner, the tip of the ultrasonic transducer of the present invention held stationary against the surface of another object will cause motion in such object. The speed of the object is determined by the frequency (step speed) and contact angle (step size) of the vibrating tip.

To produce satisfactory frictional contact between the vibrating tip and the surface of the object, either, or both the surfaces of the tip and the object must have a high coefficient of friction. This may be achieved by providing a surface coating either on the tip or on the object surface that is slightly compliant. For example, if the surface of the object to be moved is coated with a cured polyamide or a hard durometer rubber, the rigid vibrating tip can mechanically engage the object surface by penetrating it slightly during the downward movement of the tip during each vibrational cycle thereof. Alternatively, if the vibrating tip is provided with such a coating, it is better able to mechanically engage a surface to be moved which is rigid or uncoated. Coatings can vary in thickness depending upon the particular application. In the case of macroscopic scale actuators, such coatings can be in a range of 50 to 500 microns in thickness. In the case of microscopic scale actuators, these coating can be in the range of 5 to 50 microns in thickness. As will be discussed below, the necessary friction can also be achieved by forming a series of grooves in the object that are engaged by the transducer tip. The spacing of the grooves should be a multiple of the step length of the transducer tip.

Figure 2:
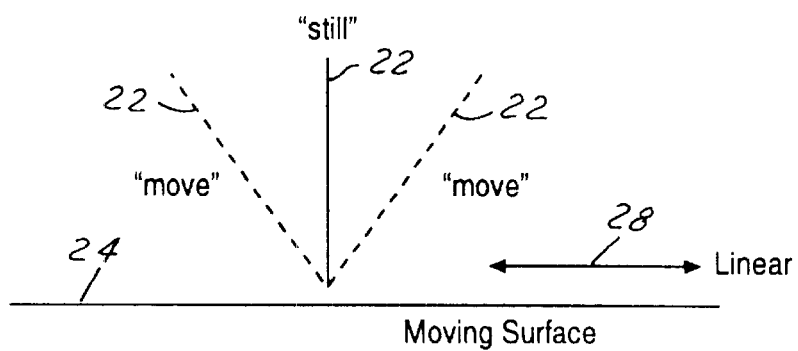
FIG. 2 is a diagrammatic view showing the various angles of inclination of the transducer tip relative to the surface of an object to be moved.

FIG. 2 practically illustrates the relation of the transducer axis to the plane of the object to be moved. When the tip axis 22 is vertical, the actuator is in the "still" position and there is no movement of the object. However, when the tip axis 22 is tilted from vertical, the object 24 moves in the direction 28, with faster movement resulting from greater angles of tip inclination.

Figures 3A, 3B:
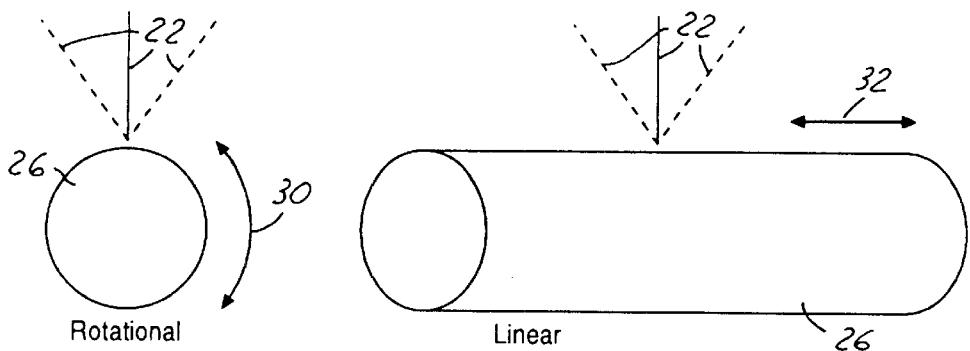
FIG. 3(a) is a diagrammatic end view of a cylinder, showing how the transducer tip is oriented to produce rotational motion of the cylinder.
FIG. 3(b) is a perspective view of the cylinder of FIG. 3a, showing how the transducer tip is employed to produce axial movement of the cylinder.

FIGS. 3a and 3b show how a single actuator according to the present invention can produce both rotational and linear motion of an object. In this case, the object is a cylinder 26. The actuator tip is used to contact the cylindrical outer surface of the cylinder 26, preferably between the opposite ends of the cylinder 26. As shown in FIG. 3a, when the actuator axis 22 is tilted from vertical in a direction transverse to the longitudinal axis of the cylinder 26, the cylinder 26 is caused to rotate in either circular direction 30, depending upon the direction of actuator inclination. However, as shown in FIG. 3b, the actuator tip axis 22 may be tilted away from vertical, but in a direction parallel to the longitudinal axis of the cylinder 26, in which case an axial component of force is imparted to the cylinder 26, causing the latter to move in the axial direction 32.

Figure 4:
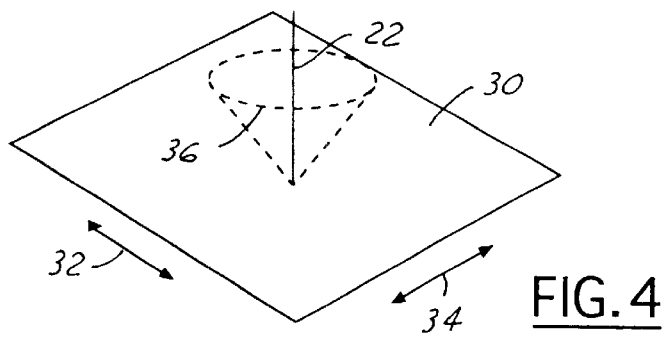
FIG. 4 is a perspective view of a planar body showing how the transducer tip may be oriented to move the body along either of two orthogonal axes.

FIG. 4 depicts a table top 30 that is moved along either of two orthogonal axes 32, 34 using an actuator that is mounted for inclination in more than one plane. In the illustrated embodiment, the actuator is mounted so as to be tiltable within a plurality of planes; the various possible positions of the actuator in these planes for a given inclination angle is represented by the cone 36. Where the actuator axis 22 can be tilted in multiple planes, such as that shown in the column 36, the table 30 may be moved not only along axes 32, 34 but in any direction aligned within the plane defined by the two axes 32, 34.

Figure 5:
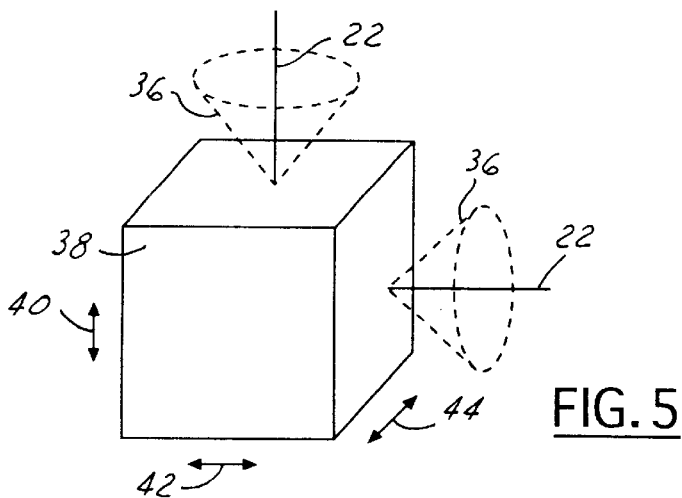
FIG. 5 is a perspective view of a cube shaped body, depicting how a pair of transducer tips may be employed to move the body along any of three orthogonal axes.

Whereas FIG. 4 depicted the movement of an object in a single plane, FIG. 5 shows how the actuator of the present invention can be employed to move an object in multiple planes. Here, an object such as a cube 38 is acted upon by two actuators whose tip axes 22 are shown to be inclinable around 360 degrees of the center perpendicular or "still" position of the actuator. Using this configuration, the two actuators can move the cube 38 along any of three orthogonal axes 40, 42, 44. Of course, it is understood that the actuators must be mounted in such a way so as to stay in contact with their respective actuating surfaces.

Figure 6:
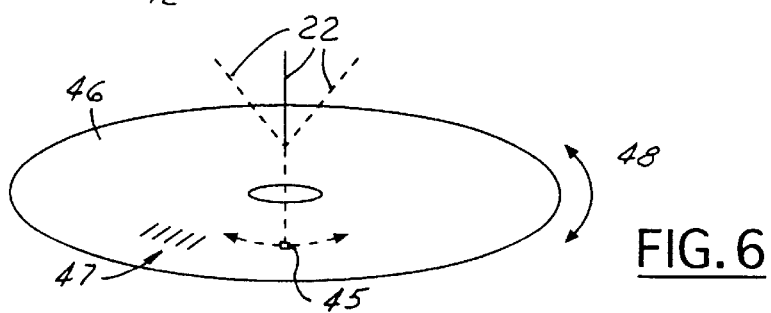
FIG. 6 perspective view of a disk showing how the transducer tip may be employed to produce rotational movement of the disk.

The actuator in the present invention can be employed, for example, to produce rotation of a disk 46 about a central axis. Such an arrangement may be advantageously employed in computer memory disks drives to move or index disks containing electronically stored information. As shown in FIG. 6, the tip of the actuator can be brought into contact with a point 45 on one flat surface of the disk 46, and at desired radial distance from the center axis thereof. In order to produce rotational motion of the disk 46 as shown by the arrows 48, the actuator tip axis 22 is tilted in either of two directions, depending upon the direction of angular motion that is desired. The rate of angular motion of the disk 46 depends in part upon the radial distance of the point of contact 45 from the disk's central axis. In order to enhance the efficiency with which power is delivered from the actuator to the disk 46, a plurality of radially oriented grooves 47 may be formed in the surface of the disk. These grooves 47 are spaced apart at a multiple at the step length of the actuator tip for a given power setting. As a result of the presence of the groves 47, there will be less slippage between end of the tip and the disk surface. The surfaces of the other types of objects that can be moved with the actuator of the present invention elsewhere described herein can also similarly benefit from the presence of grooves in the object's surface that are matched to multiples at the step length of the actuator tip in order to improve the efficiency of movement imparted by the tip.

Figure 10A:
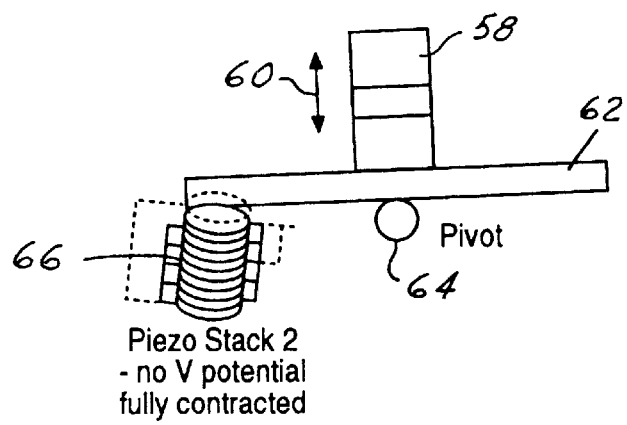
Figure 10B:
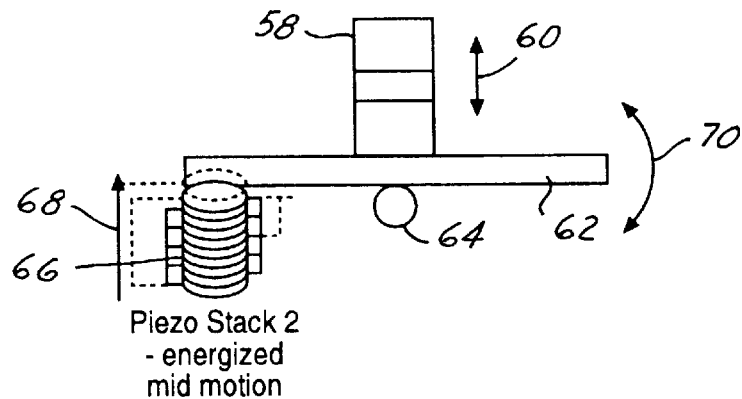
Figure 10C:
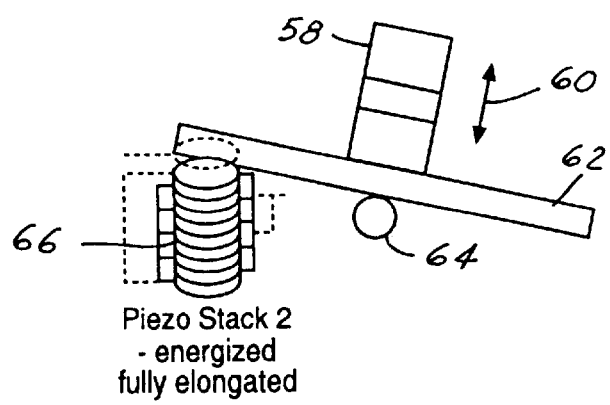

FIGS. 10a–10c show how actuators in accordance with the present invention can be employed in a mechanism to produce the tilting movement of a rigid body. A first actuator 58 is provided which vibrates in the direction of the arrow 60, and imparts a vibrational force on the rigid body 62. The force applied by actuator 58 holds the rigid body against a pivot or fulcrum 64. A second actuator comprising a stack of piezoelectric crystals 66 contacts the bottom surface of one end of the rigid body 62. FIG. 10a shows the position of the elements when actuator 58 is energized but no voltage is applied to actuator 66, and thus the stack of crystals 66 is fully contracted. In FIG. 10b, actuator 66 has been energized by the application of voltage thereto causing the crystals 66 to expand in the direction of arrow 68, and thereby cause the body 62 to pivot in the direction of arrows 70, about the fulcrum 64. FIG. 10c shows the actuator 68 fully extended. As a result, the rigid body 62 is pivoted from a left tilt position to a right tilting position. This double actuator arrangement may be advantageously employed to produce motion that is required for spinning media or linear actuators such as sliding read/write heads.

From the foregoing, it is apparent that the novel actuator and method for inducing motion in an object as described above not only provide for the reliable accomplishment of the objects of the invention, but does so in a particularly effective and economical manner. It is recognized, of course, that those skilled in the art may make various modifications of the invention without departing from the spirit and scope of the present contribution to the art. Accordingly it is to be understood that the protection sought and to be afforded hereby should be deemed to extend to the subject matter claimed and all equivalents thereof fairly within the scope of the invention.

What is claimed is:

1. An actuator for producing tilting movement of a rigid body about a fulcrum, comprising:
   a piezoelectric device contacting one end of said body, said piezoelectric device being longitudinally extendable in response to the application thereto of electrical power, the extension of said device imposing a moment on said body causing said body to tilt about said fulcrum; and
   an ultrasonic transducer generating longitudinal vibratory movement in response to the application thereto of alternating current electrical power, said transducer including a transducer tip contacting and imposing a force on said body, said transducer tip force holding said body on said fulcrum during tilting of said body.

2. The actuator of claim 1, wherein said ultrasonic transducer includes at least 2 piezoelectric crystals arranged to generate said longitudinal vibratory movement.

3. The ultrasonic actuator of claim 1, wherein each of said device and said transducer has a length between 0.01 and 1 inch.

4. The ultrasonic actuator of claim 1, wherein each of said device and said transducer has a length of between 1 and 10 inch.

5. The actuator of claim 1, wherein said transducer includes a cylindrical housing, said crystals are restrained for longitudinal expansion and contraction within said housing, and said tip is disposed on one end of said housing.

6. The actuator of claim 1, wherein said tip includes a coating of compliant material thereon.

7. The actuator of claim 6, wherein said compliant material is a cured polyamide.

8. The actuator of claim 6, wherein said compliant material is rubber.

* * * * *